(12) United States Patent
Won (10) Patent No.: US 12,394,667 B2
(45) Date of Patent: Aug. 19, 2025

(54) BIT LINE SPACER STRUCTURES INCLUDING AIR GAPS AND METHOD FOR FORMING THE SAME

(71) Applicant: CHANGXIN MEMORY TECHNOLOGIES, INC., Hefei (CN)

(72) Inventor: Daejoong Won, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 750 days.

(21) Appl. No.: 17/650,843

(22) Filed: Feb. 12, 2022

(65) Prior Publication Data

US 2023/0009103 A1    Jan. 12, 2023

Related U.S. Application Data

(63) Continuation of application No. PCT/CN2021/117092, filed on Sep. 8, 2021.

(30) Foreign Application Priority Data

Jul. 7, 2021 (CN) .......................... 202110767947.5

(51) Int. Cl.
*H01L 21/768* (2006.01)
*H10B 12/00* (2023.01)

(52) U.S. Cl.
CPC .... *H01L 21/7682* (2013.01); *H01L 21/76825* (2013.01); *H01L 21/76832* (2013.01); *H01L 21/76834* (2013.01); *H01L 21/76885* (2013.01); *H10B 12/482* (2023.02)

(58) Field of Classification Search
CPC .......... H01L 21/7682; H01L 21/76825; H01L 21/76834; H01L 21/76885
See application file for complete search history.

(56) References Cited

U.S. PATENT DOCUMENTS

| 8,241,991 | B2 * | 8/2012 | Hsieh | H01L 21/7682 |
| | | | | 438/618 |
| 9,041,122 | B2 * | 5/2015 | Yoo | H01L 21/76834 |
| | | | | 257/E21.573 |
| 9,425,200 | B2 * | 8/2016 | Hwang | H01L 23/5226 |
| 11,239,111 | B1 * | 2/2022 | Huang | H01L 21/76831 |
| 11,342,331 | B2 * | 5/2022 | Kim | H01L 21/76897 |
| 2019/0123051 | A1 * | 4/2019 | Park | H10D 84/0147 |

* cited by examiner

*Primary Examiner* — Daniel Luke
(74) *Attorney, Agent, or Firm* — Syncoda LLC; Feng Ma (57) ABSTRACT

A method for forming a semiconductor device includes the following: after sacrificial side walls are formed on the side walls of conductive connection structures, forming an outer side wall material layer on the surfaces of the sacrificial side walls; perforating the outer side wall material layer to form pinholes in the outer side wall material layer which expose the surfaces of the sacrificial side walls; removing the sacrificial side walls through the pinholes to form air gaps; and forming a cover layer for sealing the pinholes.

17 Claims, 12 Drawing Sheets

BIT LINE SPACER STRUCTURES INCLUDING AIR GAPS AND METHOD FOR FORMING THE SAME

CROSS-REFERENCE TO RELATED APPLICATIONS

This is a continuation of International Application No. PCT/CN2021/117092 filed on Sep. 8, 2021, which claims priority to Chinese Patent Application No. 202110767947.5 filed on Jul. 7, 2021. The disclosures of these applications are hereby incorporated by reference in their entirety.

BACKGROUND

A Dynamic Random Access Memory (DRAM) is a semiconductor memory device commonly used in computers, which includes multiple storage cells. Each storage cell typically includes a capacitor and a transistor. A gate electrode of the transistor is connected to a word line, a drain region is connected to a bit line, and a source electrode is connected to the capacitor. Voltage signals on the word line can control the transistor to be turned on or off, so that data information stored in the capacitor can be read through the bit line, or data information can be written into the capacitor through the bit line for storage.

SUMMARY

The disclosure relates to the field of a memory, in particular to a semiconductor device and a method for forming the same.

Some embodiments of the disclosure provide a method for forming a semiconductor device, including:
  providing a base, on which multiple discrete conductive connection structures are formed;
  forming sacrificial side walls on side walls of the conductive connection structures;
  forming an outer side wall material layer on surfaces of the sacrificial side walls;
  perforating the outer side wall material layer to form pinholes in the outer side wall material layer which expose the surfaces of the sacrificial side walls;
  removing the sacrificial side walls through the pinholes to form air gaps; and
  forming a cover layer for sealing the pinholes.

The disclosure further provides a semiconductor device, including:
  a base, on which multiple discrete conductive connection structures are formed;
  an outer side wall material layer formed on side surfaces of the conductive connection structures, air gaps being provided between the outer side wall material layer and the side surfaces of the conductive connection structures, the outer side wall material layer being provided with pinholes toward the air gaps; and
  a cover layer formed on a side surface of the outer side wall material layer, a thickness of the cover layer being smaller than that of the outer side wall material layer, and each of the pinholes being partially filled with the cover layer to seal the air gaps.

DETAILED DESCRIPTION

As described in the background, large parasitic capacitance exists between bit lines of the DRAM in the prior art, which affects the read and write performance of the DRAM.

Therefore, the disclosure provides a semiconductor device and a method for forming the same. In the method, after sacrificial side walls are formed on the side walls of conductive connection structures, an outer side wall material layer is formed on the surfaces of the sacrificial side walls. The outer side wall material layer is perforated to form pinholes in the outer side wall material layer which expose the surfaces of the sacrificial side walls. The sacrificial side walls are removed through the pinholes to form air gaps. A cover layer is formed to seal the pinholes. Since the pinholes formed in the outer side wall material layer may be located at multiple positions in the outer side wall material layer, an etching solution can remove the sacrificial side walls from multiple positions through the multiple pinholes, so that the sacrificial side walls can be removed thoroughly. As a result, residue of the material of the sacrificial side walls can be prevented or reduced, and the size of the formed air gaps can be increased, which is more favorable for reducing the parasitic capacitance between the conductive connection structures and improving the performance of the device (such as the read and write performance of the DRAM).

To make the objectives, features and advantages of the disclosure to be understood more easily, specific implementations of the disclosure will be described in detail below with reference to the drawings. In the detailed description of the embodiments of the disclosure, the schematic diagrams will be partially enlarged not to scale for ease of illustration, and the schematic diagrams are merely for illustration, which should not be construed as limitations to the scope of disclosure herein. In addition, the actual production process should include three dimensions of length, width and depth.

Figure 1:
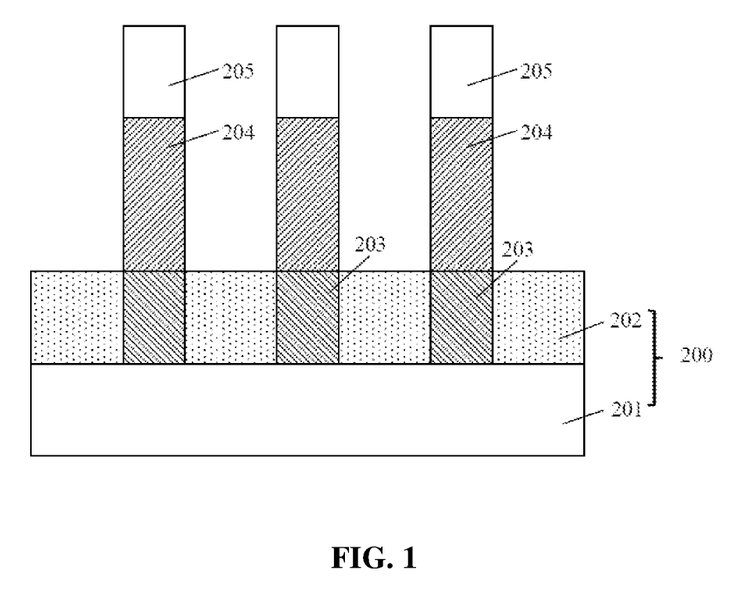
FIG. 1 illustrates a first schematic structural diagram of the forming process of a semiconductor device according to embodiments of the disclosure.

With reference to FIG. 1, a base 200 is provided, on which multiple discrete conductive connection structures 204 are formed.

A semiconductor device may be formed in the base 200, which may be one or two of a memory or a transistor, or a semiconductor device with other functions. The conductive connection structures are connected to the semiconductor device.

According to the embodiment, the base 200 includes a semiconductor substrate 201 and a bottom dielectric layer 202 on the semiconductor substrate 201.

The material of the semiconductor substrate 201 may be silicon (Si), germanium (Ge), or germanium-silicon (GeSi), silicon carbide (SiC); or silicon on insulator (SOI), germanium on insulator (GOI); or other materials, such as III-V group compounds such as gallium arsenide. According to the embodiment, the material of the semiconductor substrate 201 is silicon. The semiconductor substrate is doped with certain doped ions as required, and the doped ions may be N-type doped ions or P-type doped ions. According to an embodiment, the doping includes well region doping and source/drain region doping. According to the embodiment, multiple trench transistors may be formed in the semiconductor substrate 201, and the multiple trench transistors are part of a DRAM device. Specifically, multiple discrete active areas (not shown in the Figures) are provided in the semiconductor substrate 201. Adjacent active areas are isolated by isolation layers. Two word line trenches are provided in each active area and the isolation layer adjacent thereto. An embedded gate electrode is provided in each word line trench. The part, between two embedded gate electrodes in each active area, of each active area is used as a drain region of the trench transistor, and the parts, at two sides of the two embedded gate electrodes, of each active area are used as two source regions of the trench transistor. The source regions are configured to be connected to capacitors of the DRAM device, and the drain regions are configured to be connected to bit line structures of the DRAM device.

The bottom dielectric layer 202 may be a single layer structure or a multi-layer stacked structure. The material of the bottom dielectric layer 202 may be silicon oxide, fluorine-doped silicon glass (FSG), a material with a low dielectric constant, other suitable materials, and/or combinations thereof. Interconnection structures 203 connecting the semiconductor device in the semiconductor substrate 201 to the conductive connection structures 204 may be formed in the bottom dielectric layer 202. According to the embodiment, the interconnection structures 203 are bit line contact structures (203) connected to the drain regions of corresponding trench transistors in the semiconductor substrate 201. According to other embodiments, interconnection structures 203 may be metal plugs.

The conductive connection structures 204 are positioned on the base. Specifically, the conductive connection structures 204 are positioned on a bottom dielectric layer 202, and connected to corresponding interconnection structures 203 in the bottom dielectric layer 202. Adjacent conductive connection structures 204 are arranged in a discrete mode. The multiple conductive connection structures 204 may be arranged regularly (the multiple conductive connection structures 204 are arranged in parallel) or irregularly (some conductive connection structures 204 may be arranged in parallel, and some conductive connection structures 204 may be arranged non-parallelly). According to the embodiments, the conductive connection structures 204 are bit line structures. The bit line structures 204 are connected to corresponding bit line contact structures 203 in the interlayer dielectric layer. Multiple bit line structures 204 are arranged in parallel. Subsequently, parasitic capacitance between adjacent bit line structures can be reduced by forming air gaps. According to other embodiments, conductive connection structures 204 may further be metal wire interconnection structures (e.g. metal interconnection wires), plug structures (e.g. metal plugs) or Damascene interconnection structures.

According to other embodiments, the base may only include a semiconductor substrate, and the conductive connection structures are formed directly on the surface of the semiconductor substrate. The conductive connection structures may be gate structures. Specifically, the gate structures may be polysilicon gate electrodes or metal gate electrodes. Subsequently, parasitic capacitance between adjacent gate structures can be reduced by forming air gaps.

According to an embodiment, hard mask layers 205 are provided on top surfaces of conductive connection structures 204, which are configured to protect the conductive connection structures 204.

Figure 2:
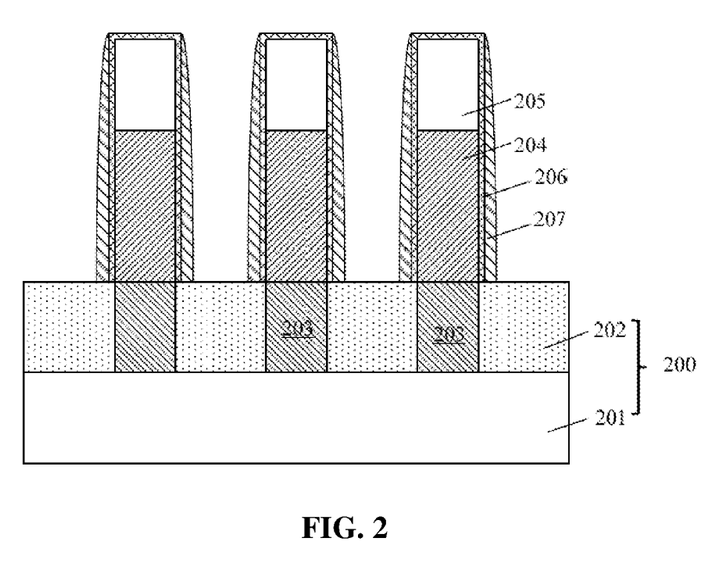
FIG. 2 illustrates a second schematic structural diagram of the forming process of a semiconductor device according to embodiments of the disclosure.

With reference to FIG. 2, sacrificial side walls 207 are formed on the side walls of the conductive connection structures 204.

The sacrificial side walls 207 are subsequently removed by pinholes formed in an outer side wall material layer to form air gaps at locations of the sacrificial side walls 207.

The material of the sacrificial side walls 207 is different from that of the subsequently formed outer side wall material layer, so that when the sacrificial side walls 207 are subsequently removed, etching of the outer side wall material layer is little or negligible to advantageously maintain the positions and shapes of the air gaps to be formed.

According to an embodiment, the material of sacrificial side walls 207 may be an oxide, in particular silicon oxide. According to other embodiments, the sacrificial side walls 207 may be made of other suitable sacrificial materials, provided that a high etching selection ratio of the sacrificial side walls 207 to an outer side wall material layer to be formed subsequently can be obtained when the sacrificial side walls are subsequently removed.

According to an embodiment, the process for forming sacrificial side walls 207 includes: forming a sacrificial side wall material layer on the side walls and top surfaces of conductive connection structures 204 and on the surfaces, between two sides of the conductive connection structures 204, of a base 200, in which the sacrificial side walls 207 may be specifically formed by a chemical vapor deposition process; and etching the sacrificial side wall material layer without a mask to form the sacrificial side walls 207 on the surfaces of the side walls of the conductive connection structures 204. It should be noted that, when hard mask layers 205 are provided on the top surfaces of the conductive connection structures 204, the sacrificial side wall material layer is formed on the surfaces of the side walls of the conductive connection structures, on the surfaces of the side walls and top surfaces of the hard mask layers 205, and on the surfaces, between two sides of the conductive connection structures, of the base 200. Accordingly, the sacrificial side walls 207 to be formed are positioned on the surfaces of the side walls of the conductive connection structures 204 and the hard mask layers 205.

According to an embodiment, the width of the sacrificial side walls 207 to be formed gradually increases from top (one end away from a base) to bottom (one end in contact with the base), such that the surfaces of the side walls of an outer side wall material layer to be formed subsequently on the surfaces of the sacrificial side walls 207 are gradually inclined outward from top to bottom, which is favorable and advantageous for forming pinholes in the outer side wall material layer which expose the surfaces of sacrificial side walls when the outer side wall material layer is subsequently perforated.

According to an embodiment, with reference to FIG. 2 again, prior to forming the sacrificial side walls 207, the method further includes forming inner side wall material layers 206 on the side walls and top surfaces of conductive connection structures 204. After the inner side wall material layers 206 are formed, the sacrificial side walls 207 are formed on the surfaces of the inner side wall material layers 206 on the side walls of the conductive connection structures 204. It should be noted that, when hard mask layers 205 are provided on the top surfaces of the conductive connection structures 204, the inner side wall material layers 206 are formed on the side walls of the conductive connection structures 204 and on the side walls and top surfaces of the hard mask layers 205. According to other embodiments, inner side wall material layers 206 to be formed may further be located on the surfaces, between two sides of the conductive connection structures 204, of a base.

The inner side wall material layers 206 are formed to protect the conductive connection structures 204 from etching damage when the sacrificial side walls 207 are subsequently removed.

The material of the inner side wall material layers 206 is different from that of the sacrificial side walls 207. According to an embodiment, the inner side wall material layers 206 may be nitride layers, carbide layers or carbonitride layers, such as silicon nitride layers, silicon carbide layers or silicon carbonitride layers. The inner side wall material layers 206 are formed by a chemical vapor deposition process.

Figure 3:
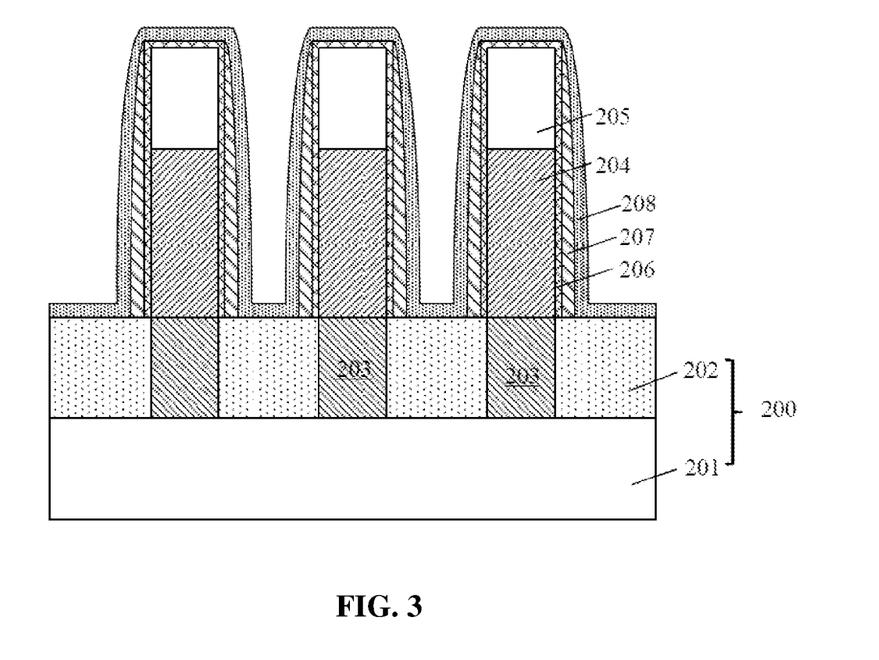
FIG. 3 illustrates a third schematic structural diagram of the forming process of a semiconductor device according to embodiments of the disclosure.

With reference to FIG. 3, an outer side wall material layer 208 is formed on the surfaces of sacrificial side walls 207.

Subsequently, the outer side wall material layer 208 is perforated to form pinholes which expose the surfaces of the sacrificial side walls, and the pinholes are used as passages to subsequently remove the sacrificial side walls 207.

The outer side wall material layer 208 is formed by the chemical vapor deposition process. A relatively high deposition temperature may be adopted to form an outer side wall material layer 208 with relatively low roughness and high purity. For example, the deposition temperature may be 300° C. to 400° C. In addition, a relatively high microwave power may be adopted to form an outer side wall material layer 208 with relatively low roughness and fine particles. For example, the microwave power may be 550 W to 750 W. The film stability of the outer side wall material layer 208 during perforating can be ensured by forming the outer side wall material layer 208 with relatively low roughness and high purity, and the outer side wall material layer 208 with relatively fine particles may be easier to be perforated subsequently.

The material of the outer side wall material layer 208 is different from that of the sacrificial side walls 207, and the outer side wall material layer 208 may be made of a material that is easy to be perforated. According to an embodiment, an outer side wall material layer 208 is a nitride layer, a carbide layer or a carbonitride layer, such as a silicon nitride layer, a silicon carbide layer or a silicon carbonitride layer. The thickness of the outer side wall material layer 208 ranges from 0.5 nm to 1 nm, so that the outer side wall material layer 208 of a specific material and a specific thickness is easier to be perforated subsequently.

According to the embodiment, the outer side wall material layer 208 is formed not only on the surfaces of the sacrificial side walls 207, but also on the top surfaces of the conductive connection structures 204. The outer side wall material layer 208 is further formed on the top surfaces of hard mask layers 205 when the hard mask layers 205 are provided on the top surfaces of the conductive connection structures 204.

Figure 4:
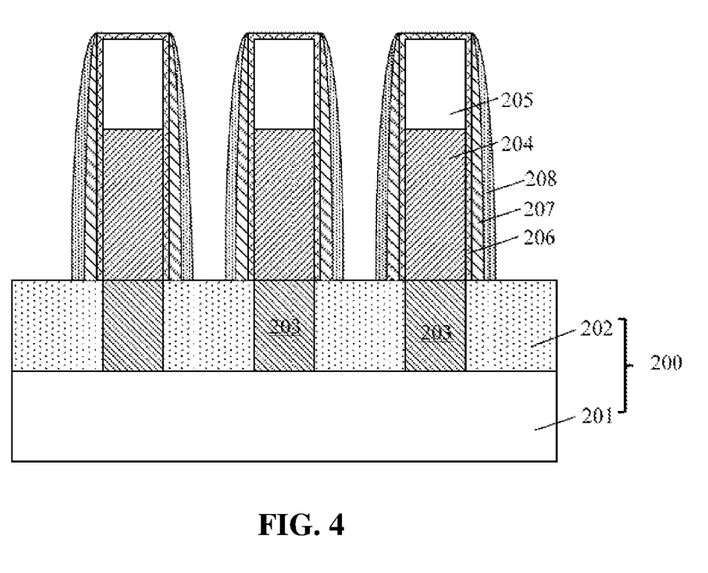
FIG. 4 illustrates a fourth schematic structural diagram of the forming process of a semiconductor device according to embodiments of the disclosure.

According to other embodiments, with reference to FIG. 4, outer side wall material layers 208 are only formed on the surfaces of sacrificial side walls 207. As a result, when the outer side wall material layers 208 are formed or after subsequently performing the perforating, the top surfaces of the sacrificial side walls 207 can be directly exposed. In this case, when the sacrificial side walls are removed, an etching solution can etch the sacrificial side walls from the top surfaces of the sacrificial side walls and through pinholes simultaneously, so that the sacrificial side walls can be easily removed thoroughly and the size of the air gaps to be formed is increased.

According to an embodiment, when the outer side wall material layers 208 are only formed on the surfaces of the sacrificial side walls 207, the process for forming the outer side wall material layers 208 includes: forming an outer side wall material film layer on the side walls and top surfaces of the conductive connection structures 204 and the surface of a base 200; and etching the outer side wall material film layer without a mask to form the outer side wall material layers 208 on the surfaces of the sacrificial side walls 207. The outer side wall material layers 208 formed thereby may not cover the top surfaces of the sacrificial side walls 207, or if the outer side wall material layer 208 formed thereby covers the top surfaces of the sacrificial side walls 207, the thickness of the outer side wall material layer 208 at such positions (near the top surfaces of the sacrificial side walls 207) may be much smaller than that of the outer side wall material layer 208 at other positions.

Figure 5:
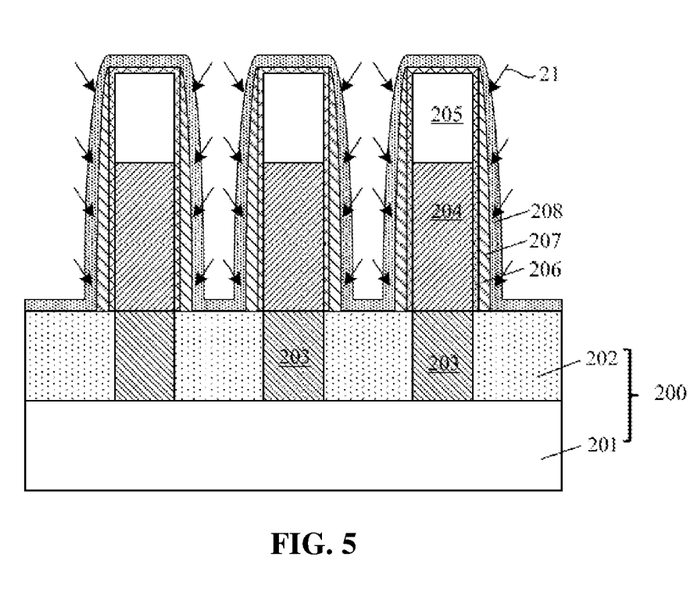
FIG. 5 illustrates a fifth schematic structural diagram of the forming process of a semiconductor device according to embodiments of the disclosure.
Figure 6:
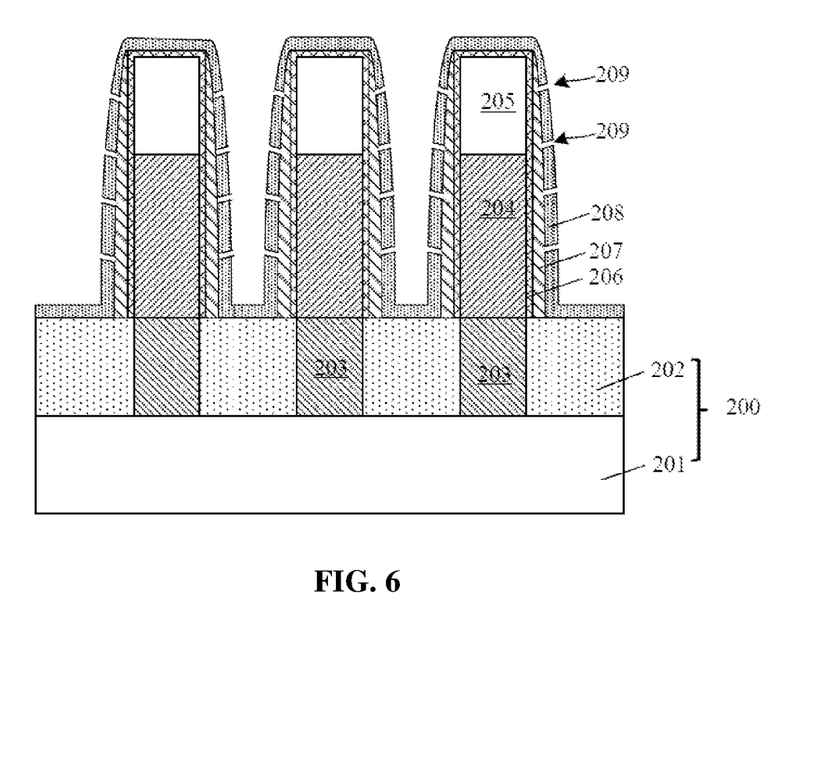
FIG. 6 illustrates a sixth schematic structural diagram of the forming process of a semiconductor device according to embodiments of the disclosure.

With reference to FIG. 5 and FIG. 6, in which FIG. 5 is made based on FIG. 3, perforating 21 is performed on the outer side wall material layer 208 (with reference to FIG. 5), and pinholes 209 which exposes the surfaces of the sacrificial side walls 207 are formed in the outer side wall material layer 208 (with reference to FIG. 6).

The pinholes 209 to be formed are holes through the outer side wall material layer 208 and exposing the surfaces of the sacrificial side walls. The etching solution can remove the sacrificial side walls 207 through the pinholes 209 subsequently. Multiple pinholes 209 are formed, which may be arranged at different positions in the outer side wall material layer 208 to expose the surfaces of the sacrificial side walls 209 at different positions.

According to an embodiment, the perforating 21 is performed by ion implantation. When low-energy and/or low-dose ion implantation is performed, implanted ions remove parts of the outer side wall material layer 208 through bombardment and/or chemical reaction, to form pinholes 209 in the outer side wall material layer 208 which expose the surfaces of sacrificial side walls.

According to an embodiment, the material of the outer side wall material layer 208 is silicon nitride, and doped ions implanted by ion implantation may be selected from dopants with large atomic mass, such as $BF_3$ and $AsH_3$ as gas sources. Relatively low implantation energy/implantation dose can be adopted, and the specific implantation energy and implantation dose depend on the selected dopants. For example, for SiN with the thickness of 0.5 nm to 1 nm, when $BF_3$ or $AsH_3$ is adopted as the dopant, the implantation energy is 1 KeV to 10 KeV, and the implantation dose is $10^{10}/cm^2$ to $10^{12}/cm^2$. The implantation angle depends on the height of the conductive connection structures, and the implantation angle may be 10 degrees to 45 degrees. In order to improve the shadowing effect, the ion implantation operation can be repeated for multiple times, for example, twice or four times.

Figure 7:
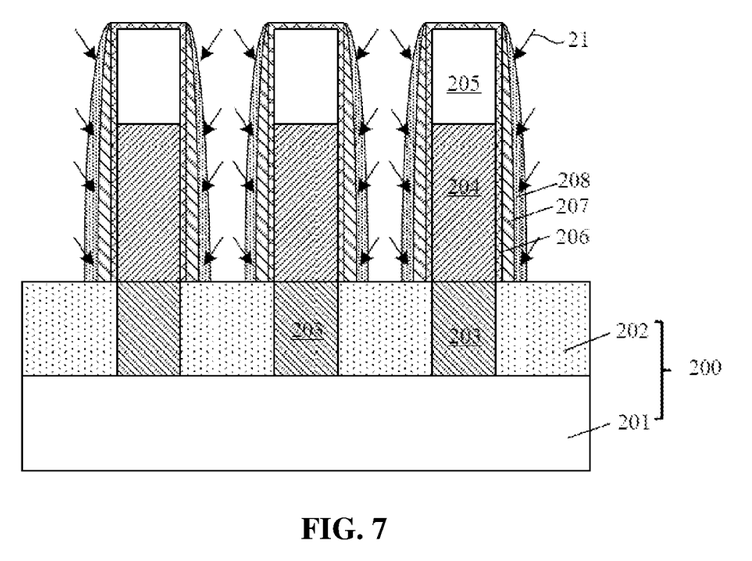
FIG. 7 illustrates a seventh schematic structural diagram of the forming process of a semiconductor device according to embodiments of the disclosure.
Figure 8:
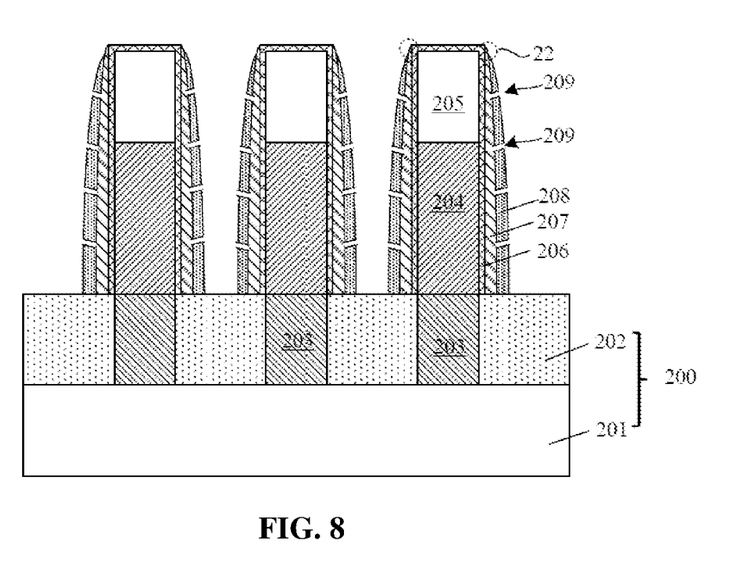
FIG. 8 illustrates an eighth schematic structural diagram of the forming process of a semiconductor device according to embodiments of the disclosure.

According to other embodiments, when outer side wall material layers 208 are only formed on the surfaces of sacrificial side walls 207, reference is made to FIG. 7 and FIG. 8, in which FIG. 7 is made based on FIG. 4. Perforating 21 is performed on the outer side wall material layers 208 (with reference to FIG. 7), and pinholes 209 exposing the surfaces of the sacrificial side walls 207 are formed in the outer side wall material layers 208 (with reference to FIG. 8). The embodiment is different from the preceding embodiment in that, after the perforating 21, the top surfaces of the sacrificial side walls 207 are exposed (as denoted by the dotted-line circles 22 shown in FIG. 8). As a result, when the sacrificial side walls 207 are removed subsequently, the sacrificial side walls 207 can be removed through both the positions at which the top surfaces of the sacrificial side walls 207 are exposed (as denoted by the dotted-line circles 22 shown in FIG. 8) and the pinholes 209, so that the sacrificial side walls can be removed more thoroughly.

Figure 9:
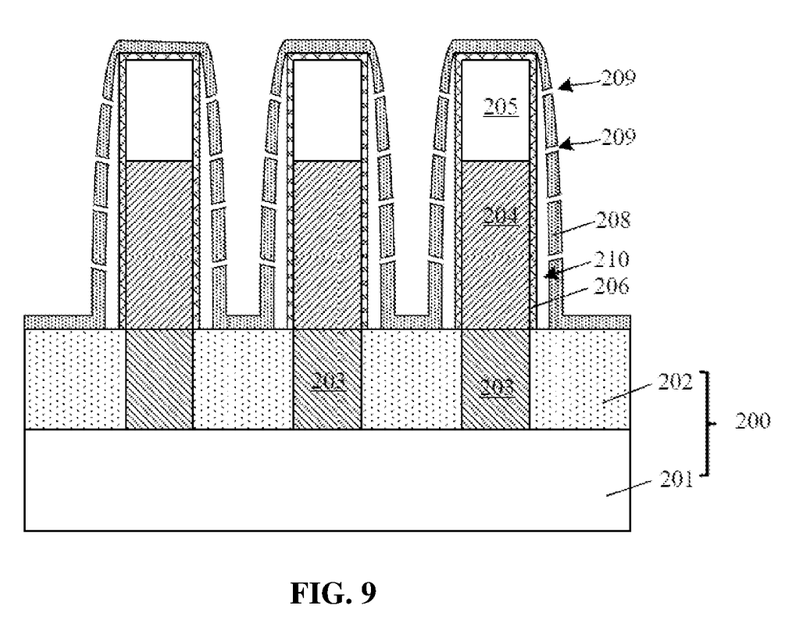
FIG. 9 illustrates a ninth schematic structural diagram of the forming process of a semiconductor device according to embodiments of the disclosure.

With reference to FIG. 9, the sacrificial side walls are removed by the pinholes 209 to form air gaps 210.

The sacrificial side walls are removed through the pinholes 209 by a wet etching process. Since the pinholes 209 are arranged at multiple positions in the outer side wall material layer 208, the etching solution can remove the sacrificial side walls from multiple positions through the multiple pinholes 209, and thus can remove the sacrificial side walls very thoroughly. As a result, residue of the material of the sacrificial side walls are prevented or reduced, and the size of the formed air gaps 210 is increased, which is more favorable for reducing the parasitic capacitance between the conductive connection structures 204 and improving the performance of the device (such as the read and write performance of the DRAM).

According to an embodiment, the material of sacrificial side walls is silicon oxide, and an etching solution used in a wet etching process is a hydrofluoric acid solution.

Figure 10:
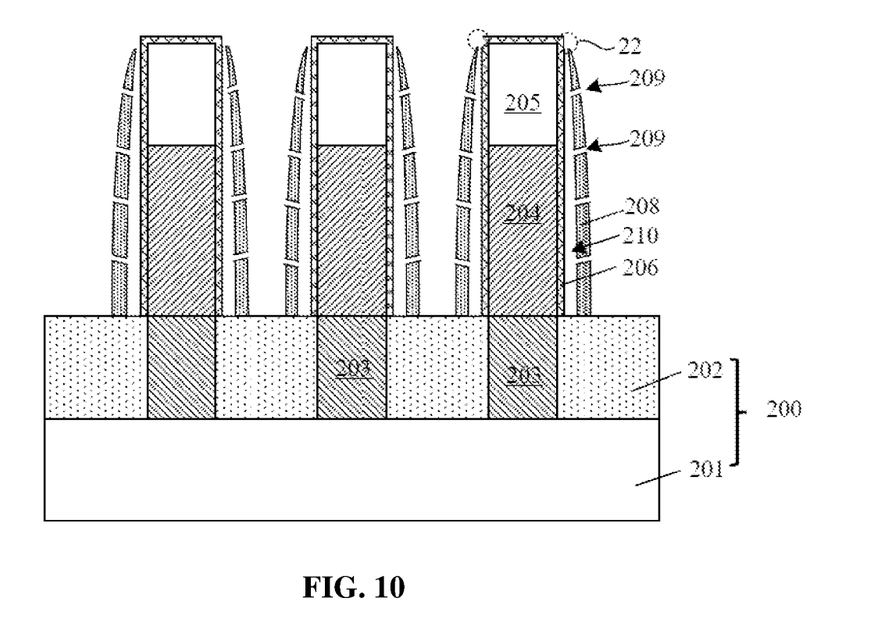
FIG. 10 illustrates a tenth schematic structural diagram of the forming process of a semiconductor device according to embodiments of the disclosure.

According to other embodiments, with reference to FIG. 10, when sacrificial side walls are removed, the sacrificial side walls can be removed through both pinholes 209 and the exposed top surfaces of the sacrificial side walls (the positions denoted by the dotted-line circles 22 shown in FIG. 10), so that the sacrificial side walls can be removed more thoroughly.

Figure 11:
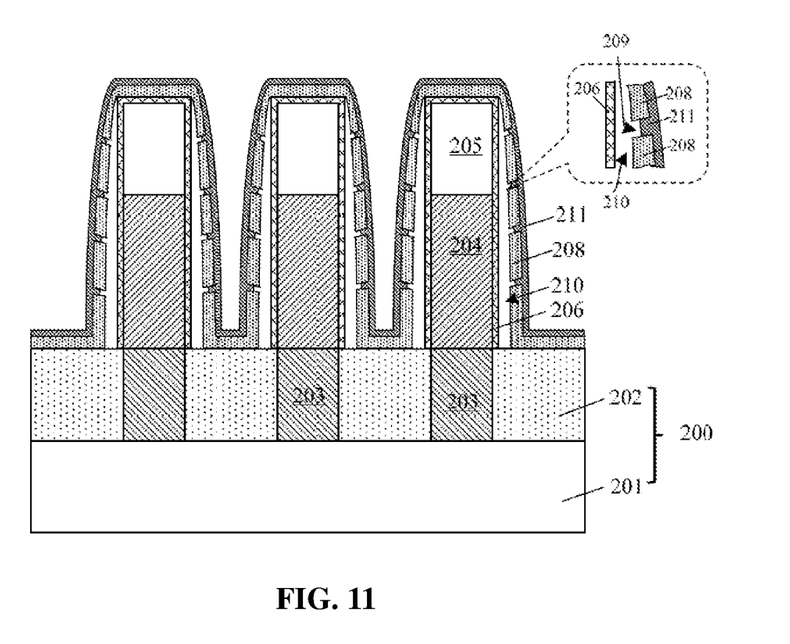
FIG. 11 illustrates an eleventh schematic structural diagram of the forming process of a semiconductor device according to embodiments of the disclosure.
Figure 12:
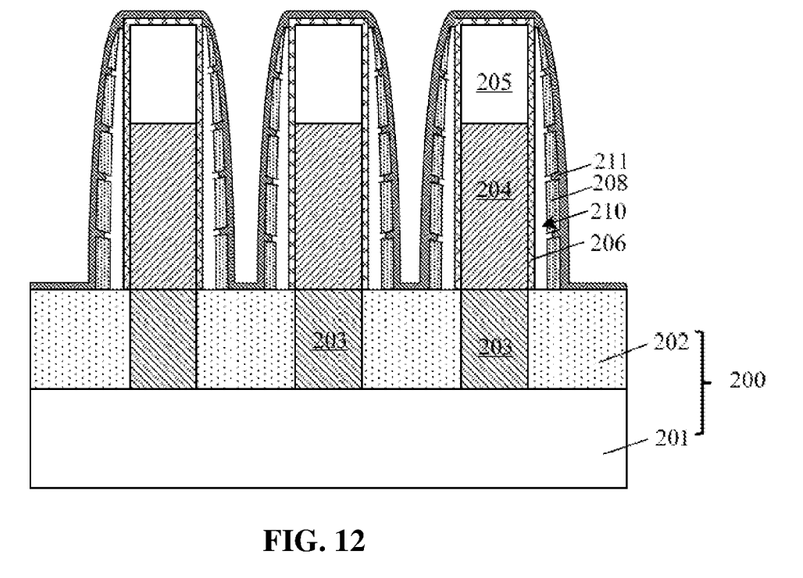
FIG. 12 illustrates a twelfth schematic structural diagram of the forming process of a semiconductor device according to embodiments of the disclosure.

With reference to FIG. 11 or FIG. 12, a cover layer 211 for sealing the pinholes 209 is formed. FIG. 11 is made based on FIG. 9, and FIG. 12 is made based on FIG. 10.

According to an embodiment, a cover layer 211 is formed by an atomic layer deposition process or plasma enhanced chemical vapor deposition. The cover layer 211 may be a nitrogen oxide layer, a nitride layer, a carbide layer or a carbonitride layer.

According to an embodiment, the cover layer 211 is formed on the surfaces of the outer side wall material layers 208 and the top surfaces of conductive connection structures 204, and the cover layer 211 is configured to seal pinholes. The cover layer 211 is formed on the surfaces of the outer side wall material layers 208 and the top surfaces of hard mask layers 205 when the hard mask layers 205 are provided on the top surfaces of the conductive connection structures 204.

According to an embodiment, the pinhole 209 is partially (not fully) filled with the formed cover layer 211 (with reference to the partially enlarged part of FIG. 11), so that the rest part of the pinhole 209 not filled with the cover layer material may be used as a part of the air gap, further increasing the size of the air gap. As a result, the parasitic capacitance between adjacent conductive connection structures 204 can be further reduced.

According to an embodiment, the thickness of a formed cover layer 211 is less than that of the outer side wall material layer 208. According to a specific embodiment, the thickness of the cover layer 211 ranges from 0.1 nm to 0.5 nm.

With reference to FIG. 11 or FIG. 12, another embodiment of the disclosure further provides a semiconductor device. The semiconductor device includes a base 200, an outer side wall material layer 208 and a cover layer 211.

On the base 200, multiple discrete conductive connection structures 204 are formed.

The outer side wall material layer 208 is formed on the side surfaces of the conductive connection structures 204. Air gaps 210 are provided between the outer side wall material layer and the side surfaces of the conductive connection structures. The outer side wall material layer 208 is provided with pinholes 209 toward the air gaps 210.

The cover layer 211 is formed on the side surface of the outer side wall material layer. The thickness of the cover layer 211 is smaller than that of the outer side wall material layer 208. The pinhole is partially filled with the cover layer 211 so as to seal the air gaps.

According to an embodiment, the thickness of an outer side wall material layer 208 ranges from 0.5 nm to 1 nm, and the thickness of a cover layer 211 ranges from 0.1 nm to 0.5 nm.

It should be noted that, the definition or description of the structures according to the embodiment (the semiconductor device) which are same or similar with those of the foregoing embodiments (the process for forming the semiconductor device) will not be repeated. Reference may be made to the definition or description of corresponding parts according to the foregoing embodiments for details.

Although the disclosure has been described as above with reference to preferred embodiments, they are not intended to limit the disclosure. Those skilled in the art can make variations and modifications to the disclosure based on the foregoing methods and technical contents without departing from the spirit and scope of the disclosure. Therefore, any simple variations, equivalents and modifications made to the foregoing embodiments according to the technical essence of the disclosure without departing from the technical solutions of the disclosure belong to the scope of the technical solutions of the disclosure.

What is claimed is:

1. A method for forming a semiconductor device, comprising:
    providing a base, on which multiple discrete conductive connection structures are formed;
    forming sacrificial side walls on side walls of the conductive connection structures;
    forming an outer side wall material layer on surfaces of the sacrificial side walls;
    perforating the outer side wall material layer to form pinholes in the outer side wall material layer which expose the surfaces of the sacrificial side walls;

wherein the perforating is performed by ion implantation; and when the ion implantation is performed, parts of the outer side wall material layer are removed by implanted ions through bombardment and/or chemical reaction, to form the pinholes in the outer side wall material layer which expose the surfaces of the sacrificial side walls;

removing the sacrificial side walls through the pinholes to form air gaps; and forming a cover layer for sealing the pinholes.

2. The method for forming the semiconductor device of claim 1, wherein a material of the outer side wall material layer is different from that of the sacrificial side walls.

3. The method for forming the semiconductor device of claim 2, wherein a material of the sacrificial side walls is an oxide, and the outer side wall material layer is a nitride layer, a carbide layer or a carbonitride layer.

4. The method for forming the semiconductor device of claim 1, wherein the material of the sacrificial side walls is silicon oxide, and the material of the outer side wall material layer is silicon nitride.

5. The method for forming the semiconductor device of claim 4, wherein doped ions implanted by the ion implantation are $BF_3$ or $AsH_3$, an implantation energy ranges from 1 KeV to 10 KeV, and an implantation angle ranges from 10 degrees to 45 degrees.

6. The method for forming the semiconductor device of claim 1, wherein the sacrificial side walls are removed through the pinholes by a wet etching process.

7. The method for forming the semiconductor device of claim 6, wherein a material of the sacrificial side walls is silicon oxide and an etching solution used in the wet etching process is a hydrofluoric acid solution.

8. The method for forming the semiconductor device of claim 1, wherein the outer side wall material layer is formed on top surfaces of the conductive connection structures in addition to the surfaces of the sacrificial side walls.

9. The method for forming the semiconductor device of claim 1, wherein the outer side wall material layer is only formed on the surfaces of the sacrificial side walls.

10. The method for forming the semiconductor device of claim 1, further comprising: prior to forming the sacrificial side walls on the side walls of the conductive connection structures, forming inner side wall material layers on the side walls and top surfaces of the conductive connection structures; wherein after the inner side wall material layers are formed, the sacrificial side walls are formed on surfaces of the inner side wall material layers on the side walls of the conductive connection structures.

11. The method for forming the semiconductor device of claim 10, wherein a material of the inner side wall material layers is different from that of the sacrificial side walls.

12. The method for forming the semiconductor device of claim 1, wherein the cover layer is formed on a surface of the outer side wall material layer and top surfaces of the conductive connection structures, and the cover layer seals the pinholes.

13. The method for forming the semiconductor device of claim 11, wherein the cover layer is formed by an atomic layer deposition process or plasma enhanced chemical vapor deposition.

14. The method for forming the semiconductor device of claim 1, wherein the conductive connection structures are bit line structures of a memory.

15. The method for forming the semiconductor device of claim 1, wherein the conductive connection structures are metal wire interconnection structures, plug structures, Damascene interconnection structures, or gate structures.

16. The method for forming the semiconductor device of claim 1, wherein each of the pinholes is partially filled with the cover layer.

17. A method for forming a semiconductor device, comprising:

providing a base, on which multiple discrete conductive connection structures are formed;

forming sacrificial side walls on side walls of the conductive connection structures;

forming an outer side wall material layer on surfaces of the sacrificial side walls;

perforating the outer side wall material layer to form pinholes in the outer side wall material layer which expose the surfaces of the sacrificial side walls;

removing the sacrificial side walls through the pinholes to form air gaps; and forming a cover layer for sealing the pinholes, wherein each of the pinholes is partially filled with the cover layer.

* * * * *